United States Patent
Zou et al.

(10) Patent No.: US 10,411,145 B2
(45) Date of Patent: Sep. 10, 2019

(54) METHOD FOR PRODUCING A TEXTURED STRUCTURE OF A CRYSTALLINE SILICON SOLAR CELL

(71) Applicant: CSI CELLS CO., LTD., Suzhou Jiangsu (CN)

(72) Inventors: Shuai Zou, Suzhou Jiangsu (CN); Xusheng Wang, Suzhou Jiangsu (CN); Guoqiang Xing, Suzhou Jiangsu (CN)

(73) Assignee: CSI CELLS CO., LTD. (CN)

( * ) Notice: Subject to any disclaimer, the term of this patent is extended or adjusted under 35 U.S.C. 154(b) by 0 days.

(21) Appl. No.: 15/634,302

(22) Filed: Jun. 27, 2017

(65) Prior Publication Data
US 2017/0373202 A1  Dec. 28, 2017

(30) Foreign Application Priority Data

Jun. 27, 2016 (CN) .......................... 2016 1 0480361

(51) Int. Cl.
*H01L 31/0236* (2006.01)
*B08B 3/08* (2006.01)
(Continued)

(52) U.S. Cl.
CPC .......... *H01L 31/02363* (2013.01); *B08B 3/08* (2013.01); *H01L 31/0284* (2013.01);
(Continued)

(58) Field of Classification Search
CPC ............ H01L 2924/0002; H01L 29/517; B01J 2523/00; B01J 35/04; B01D 53/9418
See application file for complete search history.

(56) References Cited

U.S. PATENT DOCUMENTS

2010/0029034 A1\* 2/2010 Nishimoto ........ H01L 31/02363
                                                                        438/71
2011/0092074 A1  4/2011 Mayer et al.
(Continued)

FOREIGN PATENT DOCUMENTS

CN  101573801 A  11/2009
CN  101976705 A   2/2011
(Continued)

OTHER PUBLICATIONS

Taiwanese Office Action for Application No. 10620573370, dated Jun. 1, 2017.
(Continued)

*Primary Examiner* — Jaehwan Oh
(74) *Attorney, Agent, or Firm* — Schmeiser, Olsen & Watts, LLP

(57) ABSTRACT

A method for producing a textured structure of a crystalline silicon solar cell is provided, including the following steps: (1) forming a porous layer structure on a surface of a silicon wafer; (2) then cleaning with a first alkaline chemical solution; (3) removing residual metal particles with a cleaning solution; (4) and then etching the surface with a first chemical etching solution to obtain the textured structure of the crystalline silicon solar cell. The method greatly prolongs the lifetime of the mixed solution of hydrofluoric acid and nitric acid and ensures the stability and uniformity of the textured structure.

14 Claims, 1 Drawing Sheet

(51) Int. Cl.
*H01L 31/028* (2006.01)
*H01L 31/18* (2006.01)

(52) U.S. Cl.
CPC ........ *H01L 31/1804* (2013.01); *H01L 31/186* (2013.01); *Y02E 10/547* (2013.01); *Y02P 70/521* (2015.11)

(56) References Cited

U.S. PATENT DOCUMENTS

| | | |
|---|---|---|
| 2011/0260097 A1 | 10/2011 | Melnyk et al. |
| 2013/0025663 A1 | 1/2013 | Liu et al. |
| 2013/0244369 A1* | 9/2013 | Nishimoto ........ H01L 31/02363 438/71 |
| 2015/0265509 A1 | 9/2015 | Zhang et al. |
| 2017/0170346 A1* | 6/2017 | Black ................ H01L 21/30604 |
| 2017/0358695 A1 | 12/2017 | Zou et al. |

FOREIGN PATENT DOCUMENTS

| | | |
|---|---|---|
| CN | 103451739 A | 12/2013 |
| CN | 104409322 A | 3/2015 |
| CN | 104562011 A | 4/2015 |
| CN | 104966762 A | 10/2015 |
| CN | 104992991 A | 10/2015 |
| CN | 105070792 A | 11/2015 |
| CN | 105226113 A | 1/2016 |
| CN | 105576081 A | 5/2016 |
| CN | 105870263 A | 8/2016 |
| EP | 2891733 A1 | 7/2015 |
| KR | 20120117687 A | 10/2012 |
| KR | 20140010155 A | 1/2014 |
| TW | 201318192 A | 5/2013 |
| TW | 201445758 A | 12/2014 |
| WO | 2012150669 A1 | 11/2012 |
| WO | 2014120830 A1 | 8/2014 |
| WO | WO2014120830 A1 | 8/2014 |

OTHER PUBLICATIONS

International Search Report for PCT Application No. PCT/CN2016/099338, dated Mar. 17, 2017.
Chinese Office Action for CN Application No. 201610480361.X, dated Aug. 17, 2017.
Search Report of Chinese Patent Application No. 201610480361.X, dated Mar. 8, 2017.

* cited by examiner

METHOD FOR PRODUCING A TEXTURED STRUCTURE OF A CRYSTALLINE SILICON SOLAR CELL

CROSS-REFERENCE TO RELATED APPLICATION

This application claims priority to Chinese Application No. 201610480361.X having a filing date of Jun. 27, 2016, the entire contents of which are hereby incorporated by reference.

FIELD OF TECHNOLOGY

The following relates to a method for producing a textured structure of a crystalline silicon solar cell, which belongs to the technical field of solar cells.

BACKGROUND

With the extensive application of solar cell modules, photovoltaic power generation has occupied a larger and larger proportion in the new energy sources, and has developed rapidly. Among the current commercial solar cell products, crystalline silicon (single crystal and polycrystalline) solar cell has accounted the largest market share, maintaining more than 85% of the market occupancy all the time.

At present, in the solar cell production process, the textured structure of the surface of a silicon wafer can effectively reduce the surface reflectivity of solar cells, which is one of the important factors that affect the photoelectric conversion efficiency of solar cells. In order to obtain a good textured structure on the surface of the crystalline silicon solar cell to achieve a better antireflection effect, many methods have been tried, commonly including mechanical grooving method, laser etching method, reactive ion etching method (RIE), chemical etching method (i.e, wet etching method), and the like. Among them, the mechanical grooving method can obtain a lower surface reflectivity, however, this method will cause a more severe mechanical damage to the surface of the silicon wafer, and the rate of finished products thereof is relatively low, therefore it is less used in the industrial production. For the laser etching method, different grooving patterns are made with laser, and striped and inverted pyramid shaped surface have been produced, the reflectivity of which can be as low as 8.3%, but the efficiency of cells produced therefrom is low, thus it cannot be effectively used for production. RIE method can use different templates for etching, which is generally dry etching, and a so-called "black silicon" structure can be formed on the surface of the silicon wafer, the reflectivity of which can be as low as 7.9%, or even up to 4%. However, due to the expensive equipment, its production cost is high, thus its use in the industrial production is less. However, the chemical etching method has characteristics of simple process, efficient cost, high quality and good compatibility with the existing process, etc., which has become the most commonly used method in the existing industry.

At present, the textured structure of a crystalline silicon solar cell produced with the wet etching is generally in micron level. The current common practice is still to further reduce its surface reflectivity. Utility Patent Application WO2014120830(A1) discloses a method for producing a nano-textured surface of a crystalline silicon, wherein the control of the morphology of the nano-textured surface is achieved by annealing. However, this method is complicated in process and is not conducive to the needs of industrial production.

In view of the above-mentioned problems, there has emerged a metal ion etching method in the prior art, such as the Chinese patent CN101573801B, which specifically includes the steps of: (1) placing a silicon wafer in a hydrofluoric acid solution containing an oxidizing agent and a metal salt to form a porous layer structure; (2) then etching the surface with a first chemical etching solution; the first chemical etching solution is a mixed solution of hydrofluoric acid and nitric acid; (3) then impregnating the above silicon wafer in a second chemical etching solution to form a textured structure; wherein the second chemical etching solution is an alkaline solution.

However, it has been found in the practical application that the above method presents the following problems: (I) the first chemical etching solution in the step (2) of the above method has two main effects, in which one is to etch the porous silicon layer formed by metal catalysis; the other one is to clean the residual metal particles on the surface of the silicon wafer; however, as the number of the silicon wafers to be treated increases, Ag ions in the first chemical etching solution in the step (2) (i.e., a mixed solution of $HF/HNO_3$) are increasing, so that the solution will change into a Ag ion-rich mixed solution of $HF/HNO_3$, and the silicon wafers in this solution will occur chemical etching reaction catalyzed by metal ions again, which will affect the stability and uniformity of the textured structure, thereby influencing the electrical properties of the solar cells; (II) As the number of the silicon wafers to be treated increases, Ag ions in the first chemical etching solution in the step (2) are increasing, and the Ag ions are adhered to the silicon wafer in a reverse direction again, thus it is difficult to wash off the Ag particles attached to the silicon wafer in the first step, thereby resulting in the lifetime of the mixed solution of $HF/HNO_3$ being very short, which further increasing the cost.

Therefore, it has a positive practical significance to develop a new method for producing a textured structure of a crystalline silicon solar cell to ensure the stability and uniformity of the textured structure, as well as the stability of the electrical properties of the solar cells, and further improve the lifetime of the mixed solution of $HF/HNO_3$.

SUMMARY

An aspect relates to a method for producing a textured structure of a crystalline silicon solar cell.

Embodiments of the present invention include a method for producing a textured structure of a crystalline silicon solar cell, comprising the steps of:
(1) forming a porous layer structure on the surface of a silicon wafer;
(2) cleaning with a first alkaline chemical solution;
(3) removing the residual metal particles with a first cleaning solution;
(4) then etching the surface with a first chemical etching solution to obtain a textured structure of a crystalline silicon solar cell; wherein the first chemical etching solution is a mixed solution of hydrofluoric acid and an oxidizing agent.

Hereinbefore, the porous layer structure belongs to the prior art and includes a porous silicon structure, and a nanowire structure, etc.

The oxidizing agent in the step (4) may be nitric acid, hydrogen peroxide, chromic acid or potassium permanganate solution.

In the above technical solution, in the step (1), the silicon wafer is placed in a hydrofluoric acid solution containing an oxidizing agent and a metal salt to form a porous layer structure; the temperature is 25-90° C. and the time is 10-1000 s.

Preferably, the concentration of the metal ions in the hydrofluoric acid solution containing the oxidizing agent and the metal salt is less than or equal to $1E^{-3}$ mol/L, or the concentration of the metal ions in the solution is greater than $1E^{-3}$ mol/L, while the concentration of HF is less than or equal to $1E^{-2}$ mol/L.

Alternatively, in the step (1), the silicon wafer is first immersed in the solution containing metal ions so that the surface of the silicon wafer is coated with metal nanoparticles; the concentration of the metal ions in the solution is less than or equal to $1E^{-3}$ mol/L, or the concentration of the metal ions in the solution is greater than $1E^{-3}$ mol/L, while the concentration of HF is less than or equal to $1E^{-2}$ mol/L; then the surface of the silicon wafer is etched with a chemical etching solution to form a porous layer structure; the temperature is 25-90° C. and the time is 30-300 s; the chemical etching solution is a mixed solution of HF and an oxidizing agent; wherein, the concentration of HF is 0.05-0.5 mol/L, and the concentration of the oxidizing agent is 1-15 mol/L.

In the above technical solution, a water washing step is provided respectively between the steps (1) and (2), between the steps (2) and (3), and between the steps (3) and (4).

In the above technical solution, in the step (2), the cleaning time is 5-250 s; the volume concentration of the alkaline substance in the first alkaline chemical solution is 0.1 to 30% and the temperature is 20-80° C.; the first alkaline chemical solution is any one or more selected from the group consisting of sodium hydroxide solution, potassium hydroxide solution, ammonia water, a mixed solution of ammonia water and hydrogen peroxide, and tetramethyl ammonium hydroxide.

Preferably, in the step (2), the cleaning time is 5-100 s; more preferably, the cleaning time is 5-50 s; further preferably, the cleaning time is 5-30 s; and the cleaning time may also be set at 10 s, 20 s, 40 s or 60 s.

Preferably, the volume concentration of the alkaline substance in the first alkaline chemical solution is 0.5-30%, more preferably, the volume concentration of which is 1-25%, further preferably, the volume concentration of which is 1-20%.

Further, the temperature of the first alkaline chemical solution is 25-80° C. More preferably, the temperature of which is 25-70° C., further preferably, is 25-50° C.

In the above technical solution, in the step (3), the first cleaning solution is selected from one of the following four solutions: a mixed solution of hydrochloric acid and hydrogen peroxide, a mixed solution of ammonia water and hydrogen peroxide, nitric acid and ammonia water; the volume concentration of nitric acid is 5-69%; and the volume concentration of ammonia water is 1-30%; the temperature of the first cleaning solution is 20-80° C. Preferably, the temperature of which is 20-70° C., further preferably, is 20-50° C.

In the above technical solution, in the step (4), the first chemical etching solution is hydrofluoric acid and nitric acid, wherein the concentration of hydrofluoric acid is 0.05-0.5 mol/L, and the concentration of nitric acid is 1-15 mol/L.

In the above technical solution, after the step (4), it further comprises the following steps:

(5) impregnating the above silicon wafer in a second chemical etching solution; and the second chemical etching solution is an alkaline solution;
wherein the alkaline solution is any one or more selected from the group consisting of sodium hydroxide solution, potassium hydroxide solution, ammonia water, and tetramethyl ammonium hydroxide; the concentration of the alkaline solution is 0.05-0.5 mol/L; and the impregnation time is 5-250 s;
(6) then cleaning the above silicon wafer in a second cleaning solution;
wherein the second cleaning solution is a mixed solution selected from any one of a mixed solution of hydrochloric acid and hydrogen peroxide and a mixed solution of ammonia water and hydrogen peroxide; the temperature of the cleaning solution is 20-80° C.; and the cleaning time is 60-300 s;
(7) then impregnating the above silicon wafer in hydrofluoric acid solution.

In the above technical solution, the function of the step (5) is to remove the porous silicon on the surface; the function of the step (6) is to remove the residual metal particles; the function of the step (7) is to remove the surface layer of silicon oxide layer. The practical solution can be selected according to the specific requirements. Specific situations include only use of step (5), use of a combination of two steps of (5) and (6), and use of a combination of three steps of step (5), step (6) and step (7).

In the above technical solution, a water washing step is provided before any one of the steps (5), (6) and (7), and after the step (7).

The embodiments of the invention meanwhile seek protection for a textured structure of a crystalline silicon solar cell produced by the above-described method. Preferably, the textured structure consists essentially of a plurality of microstructures resembling an inverted pyramid; the lower part of the microstructure resembling an inverted pyramid is an inverted pyramid structure and the upper part of which is an inverted cone structure; the top of the microstructure resembling an inverted pyramid is selected from one or more of a circle, an ellipse or a closed pattern enclosed by a plurality of curves; the size of the microstructure resembling an inverted pyramid is 100-900 nm; the textured structure also has a microstructure of a plurality of upright pyramids.

Hereinbefore, the top of the microstructure resembling an inverted pyramid is selected from one or more of a circle, an ellipse or a closed pattern enclosed by a plurality of curves, wherein, the closed pattern enclosed by a plurality of curves includes at least three curves, of course it can also be enclosed by more curves, preferably 5-8 curves. The top of the inverted cone structure refers to the bottom surface of the cone, since it is inverted, the bottom surface of the cone becomes the top of the microstructure.

The textured structure has a plurality of microstructures resembling an inverted pyramid, these structures resembling an inverted pyramid may be independently dispersed on the surface of the silicon wafer, or may be partially overlapped, or the plurality of inverted cone structures may partially overlap each other. The depth of the microstructure resembling an inverted pyramid is 100-900 nm. The average reflectivity of the textured structure is 2-20%. Preferably, the average reflectivity of the textured structure is 5-15%.

The basic principle of embodiments of the present invention is that the first alkaline chemical solution in the step (2) can be used to remove the porous silicon structure on the surface, so as to expose the underlying nano-textured structure, meanwhile peeling off a large amount of metal particles in the porous silicon. Next, the residual metal at the bottom of the nanostructure is completely removed with the first cleaning solution in the step (3), and the treated silicon wafer will not bring the metal particles into the etching solution when entering the first chemical etching solution, thereby avoiding the formation of the metal catalyzed redox system again in the first chemical etching solution which affects the stability and uniformity of the textured structure.

On the other hand, removing the metal particles before the first chemical etching solution can also prevent the accumulation of more and more metal particles in the system. Because a large amount of metal particles will be adhered to the surface of the silicon wafer in an opposite direction, which are difficult to be removed, on the one hand it will affect the lifetime of the etching solution, on the other hand it will cause the photoelectric conversion efficiency of the solar cell to be significantly reduced.

Another technical solution corresponding to the above is a method for producing a textured structure of a crystalline silicon solar cell, comprising the following steps:
(1) forming a porous layer structure on the surface of the silicon wafer;
(2) cleaning with a second alkaline chemical solution, and removing the residual metal particles;
(3) then etching the surface with the first chemical etching solution to obtain a textured structure of a crystalline silicon solar cell; wherein the first chemical etching solution is a mixed solution of hydrofluoric acid and an oxidizing agent.

That is, in the steps (2) and (3) of the first technical solution, a same chemical solution are selected, in such case these two steps can be combined. Of course, such choice of the same chemical solution is very special, it can not only remove the porous silicon structure on the surface to expose the underlying nano-textured structure, meanwhile peeling off a large amount of metal particles in the porous silicon; but also can completely remove the residual metal at the bottom of the nanostructure.

In the above technical solution, in the step (1), the silicon wafer is placed in a hydrofluoric acid solution containing an oxidizing agent and a metal salt to form a porous layer structure; the temperature is 25-90° C. and the time is 10-1000 s.

Preferably, the concentration of the metal ions in the hydrofluoric acid solution containing the oxidizing agent and the metal salt is less than or equal to $1E^{-3}$ mol/L, or the concentration of the metal ions in the solution is greater than $1E^{-3}$ mol/L, while the concentration of HF is less than or equal to $1E^{-2}$ mol/L.

Alternatively, in the step (1), the silicon wafer is first immersed in the solution containing metal ions so that the surface of the silicon wafer is coated with metal nanoparticles; the concentration of the metal ions in the solution is less than or equal to $1E^{-3}$ mol/L, or the concentration of the metal ions in the solution is greater than $1E^{-3}$ mol/L, while the concentration of HF is less than or equal to $1E^{-2}$ mol/L; then the surface of the silicon wafer is etched with a chemical etching solution to form a porous layer structure; the temperature is 25-90° C. and the time is 30-300 s; the chemical etching solution is a mixed solution of HF and an oxidizing agent; wherein, the concentration of HF is 0.05-0.5 mol/L, and the concentration of the oxidizing agent is 1-15 mol/L.

In the above technical solution, a water washing step is provided respectively between the steps (1) and (2), and between the steps (2) and (3).

In the above technical solution, in the step (2), the cleaning time is 5-250 s; the volume concentration of the alkaline substance in the second alkaline chemical solution is 0.1-30% and the temperature is 20-80° C.;
the second alkaline chemical solution is any one selected from the group consisting of ammonia water and a mixed solution of ammonia water and hydrogen peroxide.

Preferably, in the step (2), the cleaning time is 5-100 s; more preferably, the cleaning time is 5-50 s; further preferably, the cleaning time is 5-30 s; and the cleaning time may also be set at 10 s, 20 s, 40 s or 60 s.

Preferably, the volume concentration of the alkaline substance in the second alkaline chemical solution is 0.5-30%, more preferably, the volume concentration of which is 1-25%, further preferably, the volume concentration of which is 1-15%.

Further, the temperature of the second alkaline chemical solution is 25-80° C. More preferably, the temperature of which is 25-70° C., further preferably, is 25-50° C.

In the above technical solution, in the step (3), the first chemical etching solution is hydrofluoric acid and nitric acid, wherein the concentration of hydrofluoric acid is 0.05-0.5 mol/L, and the concentration of nitric acid is 1-15 mol/L.

In the above technical solution, after the step (3), it further comprises the following steps:
(4) impregnating the above silicon wafer in a second chemical etching solution; and the second chemical etching solution is an alkaline solution;
wherein the alkaline solution is any one or more selected from the group consisting of sodium hydroxide solution, potassium hydroxide solution, ammonia water, and tetramethyl ammonium hydroxide;
(5) then cleaning the above silicon wafer in the cleaning solution;
wherein the cleaning solution is any one of a mixed solution of hydrochloric acid and hydrogen peroxide and a mixed solution of ammonia water and hydrogen peroxide;
(6) then impregnating the above silicon wafer in hydrofluoric acid solution.

In the above technical solution, a water washing step is provided before any one of the steps (4), (5) and (6), and after the step (6).

The embodiments of the present invention meanwhile seek protection for a textured structure of a crystalline silicon solar cell produced by the above-described method. Preferably, the textured structure consists essentially of a plurality of microstructures resembling an inverted pyramid; the lower part of the microstructures resembling an inverted pyramid is an inverted pyramid structure and the upper part of which is an inverted cone structure; the top of the microstructure resembling an inverted pyramid is selected from one or more of a circle, an ellipse or a closed pattern enclosed by a plurality of curves; the size of the microstructure resembling an inverted pyramid is 100-900 nm; the textured structure also has a microstructure of a plurality of upright pyramids.

Hereinbefore, the top of the microstructure resembling an inverted pyramid is selected from one or more of a circle, an ellipse or a closed pattern enclosed by a plurality of curves, wherein, the closed pattern enclosed by a plurality of curves includes at least three curves, of course it can also be enclosed by more curves, preferably 5-8 curves. The top of the inverted cone structure refers to the bottom surface of the cone, since it is inverted, the bottom surface of the cone becomes the top of the microstructure.

The textured structure has a plurality of microstructures resembling an inverted pyramid, these structures resembling an inverted pyramid may be independently dispersed on the surface of the silicon wafer, or may be partially overlapped, or the plurality of inverted cone structures may partially overlap each other. The depth of the microstructure resembling an inverted pyramid is 100-900 nm. The average reflectivity of the textured structure is 2-20%. Preferably, the average reflectivity of the textured structure is 5-15%.

As a result of the application of the above-described technical solutions, embodiments of the present invention has the following advantages over the prior art:

1. The embodiments of the invention add a cleaning step with alkaline chemical solution, which can rapidly etch and remove the Ag particles-rich porous silicon layer, and greatly reduce the amount of Ag dissolved in the mixed solution of hydrofluoric acid and an oxidizing agent to be cleaned in each treatment, thereby substantially prolonging the lifetime of the mixed solution of hydrofluoric acid and nitric acid and ensuring the stability and uniformity of the textured structure; experiments have shown that compared to the technical solutions in the prior art without the cleaning step using the alkaline chemical solution, the life of the mixed solution of hydrofluoric acid and nitric acid of the present application can be increased from the existing 2000 silicon wafers to 80,000 silicon wafers, therefore an unexpected effect has been achieved;

2. The embodiments of the invention adds a cleaning step with the first cleaning solution, which can further remove the metallic silver particles and ensure the complete removal of the Ag residues on the silicon wafer, thereby guaranteeing the stability of the electrical properties of the solar cells; experiment has demonstrated that compared to the technical solutions in the prior art without the cleaning step using the cleaning solution, the open circuit voltage and the short circuit current of the present application have also been improved remarkably, and the photoelectric conversion efficiency has been improved by more than 0.3%, therefore an unexpected effect has been achieved;

3. The embodiments of the invention adopts chemical etching to form the nano-sized texture surface without the mask etching, which has the simple operation process and good compatibility with the existing industrial production process, and can be quickly transplanted into the industrial production, and is suitable for popularization and application.

BRIEF DESCRIPTION

Some of the embodiments will be described in detail, with reference to the following figures, wherein like designations denote like members, wherein.

DETAILED DESCRIPTION

The embodiments of the invention will be further described below in combination with Examples.

Example 1

Figure 1:
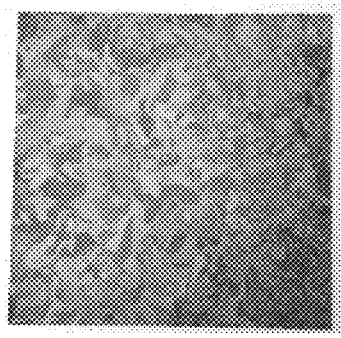
FIG. 1 is a view of a texture surface of the silicon wafer after being textured in Example 1.

As shown in FIG. 1, a method for producing a textured structure of a crystalline silicon solar cell, comprising the following steps:

(1) placing the silicon wafer in a hydrofluoric acid solution containing an oxidizing agent and a metal salt to form a porous layer structure; the temperature being 50° C. and the time being 10-1000 s;

(2) washing with water; then cleaning with alkaline chemical solution;

wherein the alkaline chemical solution was selected from sodium hydroxide solution; and the cleaning time was 5-250 s;

wherein the volume concentration of the alkaline chemical solution was 10% and the temperature was 50° C.;

(3) washing with water; then removing the residual metal particles with the first cleaning solution;

wherein the first cleaning solution was a mixed solution selected from any one of nitric acid, ammonia water, a mixed solution of hydrochloric acid and hydrogen peroxide and a mixed solution of ammonia water and hydrogen peroxide;

(4) washing with water; then etching the surface with the first chemical etching solution; wherein the first chemical etching solution was a mixed solution of hydrofluoric acid and nitric acid; the temperature was 40° C. and the time was 5-250 s;

(5) washing with water; then impregnating the above silicon wafer in a second chemical etching solution to form the textured structure; wherein the second chemical etching solution was an alkaline solution;

wherein the alkaline solution was selected from potassium hydroxide, the concentration of the alkaline solution was 0.05-0.5 mol/L; and the impregnation time was 5-250 s;

(6) washing with water; then cleaning the above silicon wafer in the second cleaning solution to remove the residual metal particles;

wherein the second cleaning solution was a mixed solution of ammonia water and hydrogen peroxide; the temperature of the cleaning solution was 30° C.; the volume concentration of ammonia water was 10%, and the volume concentration of hydrogen peroxide was 10%;

(7) washing with water; then impregnating the silicon wafer in the hydrofluoric acid solution; washing with water to obtain the textured structure of a crystalline silicon solar cell.

Example 2

Figure 2:
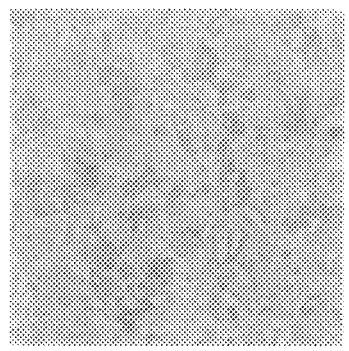
FIG. 2 is a view of a texture surface of the silicon wafer after being textured in Example 2.

As shown in FIG. 2, a method for producing a textured structure of a crystalline silicon solar cell, comprising the following steps:

(1) placing the silicon wafer in a hydrofluoric acid solution containing an oxidizing agent and a metal salt to form a porous layer structure; the temperature being 50° C. and the time being 10-1000 s;

(2) washing with water; then cleaning with alkaline chemical solution;

wherein the alkaline chemical solution was selected from sodium hydroxide solution; and the cleaning time was 5-250 s;

wherein the volume concentration of the alkaline chemical solution was 10% and the temperature was 50° C.;

(3) washing with water; then removing the residual metal particles with the first cleaning solution;

wherein the first cleaning solution was a mixed solution selected from any one of nitric acid, ammonia water, a mixed solution of hydrochloric acid and hydrogen peroxide and a mixed solution of ammonia water and hydrogen peroxide;

(4) washing with water; then etching the surface with the first chemical etching solution was a mixed solution of hydrofluoric acid and nitric acid; the temperature was 40° C. and the time was 5-250 s;

washing with water to obtain the textured structure of a crystalline silicon solar cell.

Comparative Example 1

Figure 3:
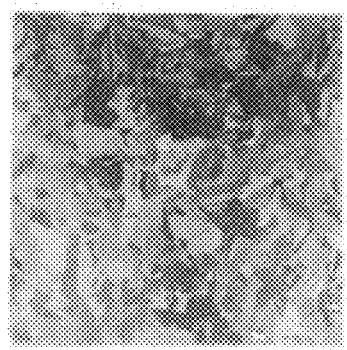
FIG. 3 is a view of a texture surface of the silicon wafer after being textured in Comparative Example 1.

As shown in FIG. 3, a method for producing a textured structure of a crystalline silicon solar cell, comprising the following steps:
(1) placing the silicon wafer in a hydrofluoric acid solution containing an oxidizing agent and a metal salt to form a porous layer structure; the temperature being 50° C. and the time being 10-1000 s;
(2) washing with water; then etching the surface with a first chemical etching solution; wherein the first chemical etching solution was a mixed solution of hydrofluoric acid and nitric acid; the temperature was 40° C. and the time was 5-250 s;
(3) washing with water; then impregnating the above silicon wafer in a second chemical etching solution to form the textured structure; wherein the second chemical etching solution was an alkaline solution;
wherein the alkaline solution was selected from potassium hydroxide, the concentration of the alkaline solution was 0.05-0.5 mol/L; and the impregnation time was 5-250 s;
(4) washing with water; then cleaning the above silicon wafer in a second cleaning solution to remove the residual metal particles;
(5) washing with water; then impregnating the above silicon wafer in hydrofluoric acid solution; and washing with water.

(I) First, the service lives of the mixed solutions of hydrofluoric acid and nitric acid in the examples and comparative example were compared, and FIG. 1 was a view of a texture surface of the surface of the silicon wafer when 2500 silicon wafers were treated in the example. FIG. 3 was a view of a texture surface of the surface of the silicon wafer when 2500 silicon wafers were treated in the comparative example. As can be seen from the comparison in the figures, the uniformity shown in FIG. 3 was very poor, indicating that at this time the mixed solution of hydrofluoric acid and nitric acid cannot be used any more. In addition, experiments had shown that the lifetime of the mixed solution of hydrofluoric acid and nitric acid in the present application can be increased to 80,000 silicon wafers.

(II) Next, the parameters of electrical properties of the mass-production of 80,000 cell wafers were compared between the examples and the comparative example, the comparison results were as follows:

|  | Uoc (mV) | Isc (A) | FF (%) | EFF |
| --- | --- | --- | --- | --- |
| Example 1 | 640.3 | 8.969 | 79.90 | 18.86% |
| Example 2 | 639.9 | 8.953 | 79.96 | 18.83% |
| Comparative Example 1 | 636.7 | 8.889 | 79.77 | 18.55% |

As can be seen from the above, with respect to the comparative example, the open circuit voltage and the short circuit current of the present application were remarkably improved as well, and the photoelectric conversion efficiency was improved by 0.31%, therefore an unexpected effect had been achieved.

The invention claimed is:
1. A method for producing a textured structure of a crystalline silicon solar cell, the method comprising:
(1) placing a silicon wafer in a hydrofluoric acid solution containing an oxidizing agent and a metal salt to form a porous layer structure or first immersing the silicon wafer in a solution containing metal ions, so that the surface of the silicon wafer is coated with a layer of metal nanoparticles, then the surface of the silicon wafer is etched with a chemical etching solution to form a porous layer structure, the chemical etching solution is a mixed solution of HF and an oxidizing agent;
(2) then cleaning with a first alkaline chemical solution;
(3) then removing residual metal particles with a first cleaning solution; and
(4) then etching the surface with a first chemical etching solution to obtain the textured structure of the crystalline silicon solar cell, wherein the first chemical etching solution is a mixed solution of hydrofluoric acid and an oxidizing agent.

2. The method according to claim 1, wherein water washing steps are provided respectively between the steps (1) and (2), between the steps (2) and (3), and between the steps (3) and (4).

3. The method according to claim 1, wherein in step (2), a cleaning time is 5-250 s, a volume concentration of an alkaline substance in the first alkaline chemical solution is 0.1 to 30% and a temperature is 20-80° C., and the first alkaline chemical solution is any one or more selected from the group consisting of: sodium hydroxide solution, potassium hydroxide solution, ammonia water, a mixed solution of ammonia water and hydrogen peroxide, and tetramethyl ammonium hydroxide.

4. The method according to claim 1, wherein in step (3), the first cleaning solution is selected from one of the following four solutions: a mixed solution of hydrochloric acid and hydrogen peroxide, a mixed solution of ammonia water and hydrogen peroxide, nitric acid and ammonia water; further wherein a volume concentration of the nitric acid is 5-69%, and a volume concentration of the ammonia water is 1-30% and a temperature of the first cleaning solution is 20-80° C.

5. The method according to claim 1, wherein in step (4) the first chemical etching solution is hydrofluoric acid and nitric acid, wherein a concentration of hydrofluoric acid is 0.05-0.5 mol/L, and a concentration of nitric acid is 1-15 mol/L.

6. The method according to claim 1, wherein after step (4), the method further comprises:
(5) impregnating the silicon wafer in a second chemical etching solution, the second chemical etching solution being an alkaline solution, wherein the alkaline solution is any one or more selected from the group consisting of: sodium hydroxide solution, potassium hydroxide solution, ammonia water, and tetramethyl ammonium hydroxide;
(6) cleaning the silicon wafer in a second cleaning solution, wherein the second cleaning solution is a mixed solution selected from any one of a mixed solution of hydrochloric acid and hydrogen peroxide and a mixed solution of ammonia water and hydrogen peroxide; and
(7) impregnating the silicon wafer in hydrofluoric acid solution.

7. The method according to claim 6, wherein water washing steps are further provided before any one of steps (5), (6) and (7), and after the step (7).

8. A method for producing a textured structure of a crystalline silicon solar cell, the method comprising:

(1) placing a silicon wafer in a hydrofluoric acid solution containing an oxidizing agent and a metal salt to form a porous layer structure or first immersing the silicon wafer in a solution containing metal ions, so that the surface of the silicon wafer is coated with a layer of metal nanoparticles, then the surface of the silicon wafer is etched with a chemical etching solution to form a porous layer structure, the chemical etching solution is a mixed solution of HF and an oxidizing agent;

(2) cleaning with a second alkaline chemical solution, and removing residual metal particles at a bottom of holes; and (3) etching the surface with a first chemical etching solution to obtain the textured structure of the crystalline silicon solar cell, wherein the first chemical etching solution is a mixed solution of hydrofluoric acid and an oxidizing agent;

(4) impregnating the above silicon wafer in a second chemical etching solution; and the second chemical etching solution is an alkaline solution.

9. The method according to claim 8, wherein water washing steps are further provided respectively between the steps (1) and (2), and between the steps (2) and (3).

10. The method according to claim 8, wherein in step (2), a cleaning time is 5-250 s; a volume concentration of an alkaline substance in the second alkaline chemical solution is 0.1 to 30%, and a temperature is 20-80° C.; further wherein the second alkaline chemical solution is any one selected from the group consisting of ammonia water, a mixed solution of ammonia water and hydrogen peroxide.

11. The method according to claim 8, wherein in step (3), the first chemical etching solution is hydrofluoric acid and nitric acid, further wherein a concentration of hydrofluoric acid is 0.05-0.5 mol/L, and a concentration of nitric acid is 1-15 mol/L.

12. The method according to claim 8, wherein
alkaline solution used in step (4) is any one or more selected from the group consisting of sodium hydroxide solution, potassium hydroxide solution, ammonia water, and tetramethyl ammonium hydroxide;

and, after step (4), (5) cleaning the silicon wafer in a cleaning solution, wherein the cleaning solution is a mixed solution selected form any one of a mixed solution of hydrochloric acid and hydrogen peroxide and a mixed solution of ammonia water and hydrogen peroxide; and (6) impregnating the silicon wafer in a hydrofluoric acid solution.

13. The method according to claim 12, wherein water washing steps are further provided before any one of the steps (4), (5) and (6), and after the step (6).

14. A textured structure of a crystalline silicon solar cell produced by the method according to claim 1.

* * * * *